(12) United States Patent
Yamasaki et al.

(10) Patent No.: US 9,001,201 B2
(45) Date of Patent: *Apr. 7, 2015

(54) COMPONENT MOUNTING APPARATUS AND COMPONENT DETECTION METHOD

(75) Inventors: Noboru Yamasaki, Yamanashi (JP); Yasuichi Okada, Yamanashi (JP); Shozo Fukuda, Yamanashi (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 336 days.

This patent is subject to a terminal disclaimer.

(21) Appl. No.: 13/582,852

(22) PCT Filed: Aug. 3, 2011

(86) PCT No.: PCT/JP2011/004407
§ 371 (c)(1),
(2), (4) Date: Sep. 5, 2012

(87) PCT Pub. No.: WO2012/023250
PCT Pub. Date: Feb. 23, 2012

(65) Prior Publication Data
US 2012/0320188 A1 Dec. 20, 2012

(30) Foreign Application Priority Data
Aug. 17, 2010 (JP) ................................ 2010-182043

(51) Int. Cl.
H05K 13/04 (2006.01)
(52) U.S. Cl.
CPC ................... *H05K 13/0413* (2013.01)

(58) Field of Classification Search
USPC ......... 348/87, 94; 29/709; 702/185; 700/121; 356/237.4; 382/147, 149
See application file for complete search history.

(56) References Cited

U.S. PATENT DOCUMENTS 5,339,248 A * 8/1994 Fujiwara et al. .............. 700/121
5,619,328 A * 4/1997 Sakurai ......................... 356/621
6,538,750 B1 * 3/2003 Fishbaine et al. ............. 356/614

(Continued)

FOREIGN PATENT DOCUMENTS

CN 1604731 A 4/2005
CN 101755497 A 6/2010

(Continued)

OTHER PUBLICATIONS

International Search Report for PCT/JP2011/004407 dated Sep. 27, 2011.

*Primary Examiner* — Brian Yenke
(74) *Attorney, Agent, or Firm* — Pearne & Gordon LLP

(57) ABSTRACT

A transfer pathway of mounting heads 10 in a component-mounting round during which the mounting head 10 moves back and forth between a component feeding unit 4 and a substrate conveyance mechanism 2 is derived by a transfer pathway calculation unit 25 for each component-mounting round from mounting program data 21*a*. On the basis of data pertaining to the thus-derived transfer pathway, image data output from a line sensor camera assigned to a head transfer range segment that the transfer pathway of the mounting head 10 crosses in each of component-mounting rounds are selected and captured by an image selection processing unit 24. The image data output from the line sensor camera whose focusing point substantially matches the imaging target can be used for detecting whether or not a component still exists.

4 Claims, 6 Drawing Sheets

(56) References Cited

U.S. PATENT DOCUMENTS

| | | | |
|---|---|---|---|
| 7,033,842 B2 * | 4/2006 | Haji et al. .......................... 438/6 |
| 7,546,678 B2 * | 6/2009 | Asai et al. ........................ 29/743 |
| 7,571,539 B2 * | 8/2009 | Maenishi et al. ................ 29/834 |
| 7,818,086 B2 * | 10/2010 | Awata et al. ................... 700/121 |
| 7,890,204 B2 * | 2/2011 | Maenishi ..................... 700/121 |
| 7,995,834 B1 * | 8/2011 | Knighton et al. ............. 382/154 |
| 8,553,080 B2 * | 10/2013 | Endo et al. ...................... 348/87 |
| 2003/0177633 A1 * | 9/2003 | Haji et al. ........................ 29/743 |
| 2005/0076498 A1 * | 4/2005 | Mizuno et al. .................. 29/740 |
| 2005/0102826 A1 | 5/2005 | Asai et al. |
| 2005/0115063 A1 * | 6/2005 | Saito et al. ....................... 29/743 |
| 2007/0074390 A1 * | 4/2007 | Ota et al. ........................ 29/833 |
| 2009/0049681 A1 | 2/2009 | Yagi et al. |
| 2010/0254788 A1 * | 10/2010 | Dromard et al. ......... 414/222.02 |
| 2010/0321487 A1 | 12/2010 | Endo et al. |
| 2012/0060357 A1 * | 3/2012 | Kaida et al. ..................... 29/593 |
| 2012/0062727 A1 * | 3/2012 | Kaida et al. ..................... 348/87 |
| 2012/0293648 A1 * | 11/2012 | Nakayama et al. ............. 348/87 |

FOREIGN PATENT DOCUMENTS

| | | |
|---|---|---|
| JP | 2006-278714 A2 | 10/2006 |
| JP | 2007-13021 A | 1/2007 |
| JP | 2009-54620 A | 3/2009 |
| JP | 2009-54819 A | 3/2009 |
| JP | 2009-54820 A | 3/2009 |
| JP | 2009-54821 A | 3/2009 |
| WO | 2007/096220 A1 | 8/2007 |

\* cited by examiner

COMPONENT MOUNTING APPARATUS AND COMPONENT DETECTION METHOD

TECHNICAL FIELD

The present invention relates to a component mounting apparatus that picks up and holds components by use of a mounting head, to thus transfer and mount the components on a substrate, and a component detection method for detecting whether or not a component is still picked up and retained by any of mounting heads of the component mounting apparatus.

BACKGROUND ART

A component mounting apparatus that mounts components, like semiconductor devices, on a substrate, repeatedly performs component mounting operation. Specifically, each of mounting heads picks up, by means of vacuum suction, a component from a component feeding unit where a plurality of parts feeders, like tape feeders, are disposed side by side. The mounting head then transfers and populates the component on a substrate positioned and held by a substrate holding unit. Faulty operation; that is, unreliable holding and releasing of a component due to stability of vacuum pickup, is likely to occur during the component mounting operation. For instance, in mounting operation for mounting components on a substrate, a component is released from a pickup nozzle by means of halting vacuum suction. At this time, there may be a case where a component will still remain adhered to and unreleased from a pickup surface of the pickup nozzle for any reasons. In such a case, a so-called "brought-back component" occurs. More specifically, during the component mounting operation, a component has not been mounted on a substrate and returns to the component feeding unit along with the mounting head while remaining unmounted. For this reason, next component mounting operation cannot be performed normally, which causes an operation error.

In order to detect such a brought-back component, a hitherto-employed component mounting apparatus has a component detecting function for detecting whether or not a component still exists on any of lower ends of pickup nozzles of mounting heads; namely, whether or not a component remains adhered to any of the lower ends (see; for instance, Patent Document 1). The related art described in connection with the example patent document is directed toward a configuration in which a component detector made up of a light projector and a line sensor camera is disposed while a transfer pathway along which a corresponding mounting head moves back and forth between a substrate retaining unit and a component feeding unit is taken as an inspection object. When a pickup nozzle of the mounting head crosses a belt-shaped inspection beam projected from the light projector toward the line sensor camera, the line sensor camera captures an image. By means of the image, detection is made as to whether or not a component still exists on any of the pickup nozzles.

RELATED ART DOCUMENT

Patent Document

Patent Document 1: JP-A-2009-54819

DISCLOSURE OF THE INVENTION

Problem that the Invention is to Solve

However, when the substrate that is to be an object of mounting operation is a long substrate that is longer than a substrate of related-art type, the foregoing related art encounters the following problems. Specifically, in a component mounting apparatus that handles a long substrate as a work object, a length of a walking beam of a head transfer mechanism that horizontally transfers the mounting heads is required to be commensurate with the length of the substrate. Hence, spacing between the light projector and the line sensor camera in the component detecting apparatus becomes considerably larger than that required when a substrate of normal size is a work object. As a consequence, an imaging focal point range achieved when the line sensor camera captures an image to detect whether or not a component still exists on any of the pickup nozzles becomes inevitably larger. Incidentally, an optical system provided in the line sensor camera hitherto has a fixed focus and hence cannot cover a wide imaging focal point range, such as that achieved when a long substrate is taken as an object. For this reason, an image captured at the position where the mounting head passes exhibits a low focusing level, which causes a case where difficulty is encountered in detecting presence or absence of a component with high precision.

Accordingly, the present invention is intended to provide a component mounting apparatus and a component detection method that make it possible to detect presence or absence of a component on a pickup nozzle of a mounting head with high precision even when a long substrate is taken as an object.

Means for Solving the Problem

A component mounting apparatus of the present invention corresponds to a component mounting apparatus that picks up components from a component feeding unit by a mounting head, transferring and mounting the component on a substrate, the apparatus comprising:

a substrate conveyance mechanism that conveys the substrate in a first direction, positioning and retaining the substrate at a component mounting operation position and a head transfer mechanism that transfers the mounting head in the first direction and a second direction orthogonal to the first direction by a first transfer mechanism and a second transfer mechanism, thereby moving the respective mounting heads between the substrate conveyance mechanism and the component feeding unit disposed beside the substrate conveyance mechanism in the second direction thereof;

an imaging unit that includes a light projection unit for projecting a belt-like inspection beam and a plurality of line sensor cameras which receive the inspection beam and which output the beam as image data representing a state of a lower end of a pickup nozzle attached to the mounting head and that are configured such that the light projection unit and the plurality of line sensor cameras are placed opposite to each other with a transfer pathway of the mounting head interposed therebetween and outside a transfer stroke of the mounting head in the first direction thereof;

optical systems that are provided for the plurality of line sensor cameras respectively and have focusing points set in correspondence with any of head transfer range segments which have been determined by dividing the transfer stroke in the first direction into a plurality of pieces, and an image selection processing unit that selectively captures image data output from the plurality of line sensor cameras;

a transfer pathway calculation unit that derives, in each of component-mounting rounds, from mounting program data targeted for the substrate the transfer pathway of the mounting head in a component-mounting round during which the mounting head is moved back and forth between the component feeding unit and the substrate conveyance mechanism;

an imaging control unit that controls the image selection processing unit on the basis of data pertaining to the derived transfer pathway, thereby selecting and capturing image data output from the line sensor cameras assigned to the head transfer range segments that the transfer pathway of the mounting head cross during each of the component-mounting rounds; and a determination processing unit that determines from the selectively captured image data whether or not a component exists on the lower end of the pickup nozzle.

A component detection method of the present invention corresponds to a component detection method for detecting whether or not a component exists on a lower end of a pickup nozzle of a mounting head in a component mounting apparatus that picks up a component from a component feeding unit by the mounting head, transferring and mounting the component on a substrate, wherein the apparatus comprises a substrate conveyance mechanism that conveys the substrate in a first direction, positioning and retaining the substrate at a component mounting operation position and a head transfer mechanism that transfers the mounting heads in the first direction and a second direction orthogonal to the first direction by a first transfer mechanisms and a second transfer mechanism, thereby moving the mounting head between the substrate conveyance mechanism and the component feeding unit disposed beside the substrate conveyance mechanism in the second direction thereof, an imaging unit that includes a light projection unit for projecting a belt-like inspection beam and a plurality of line sensor cameras which receive the inspection beam and which output the beam as image data representing a state of a lower end of a pickup nozzle attached to the mounting head and that are configured such that the light projection unit and the plurality of line sensor cameras are placed opposite to each other with a transfer pathway of the mounting head interposed therebetween and outside a transfer stroke of the mounting head in the first direction thereof, and optical systems provided for the plurality of line sensor cameras respectively and have focusing points set in correspondence with any of head transfer range segments which have been determined by dividing the transfer stroke in the first direction into a plurality of pieces, and an image selection processing unit that selectively captures image data output from the plurality of line sensor cameras; and wherein the method includes a transfer pathway calculation step of deriving, in each of component-mounting rounds, from mounting program data targeted for the substrate the transfer pathway of the mounting head in a component-mounting round during which the mounting head is moved back and forth between the respective component feeding units and the substrate conveyance mechanism, an imaging control step of controlling the image selection processing unit on the basis of data pertaining to the derived transfer pathways, thereby selecting and capturing image data output from the line sensor cameras assigned to the respective head transfer range segments that the transfer pathways of the mounting head cross during each of the component-mounting rounds, and a determination processing step of determining from the selectively captured image data whether or not a component still exists on the lower end of the pickup nozzle.

Advantage of the Invention

According to the present invention, a transfer pathway of each of mounting heads in a component-mounting round during which the mounting head moves back and forth between a corresponding component feeding unit and a substrate conveyance mechanism is derived for each component-mounting round from mounting program data. On the basis of data pertaining to the thus-derived transfer pathway, image data output from a line sensor camera assigned to a head transfer range segment that the transfer pathway of the mounting head crosses in each of component-mounting rounds are selected and captured. Even when a long substrate is taken as an object, it is possible to detect with high precision whether or not a component still exists on any of the pickup nozzles of the mounting heads.

EMBODIMENT FOR IMPLEMENTING THE INVENTION

Figure 1:
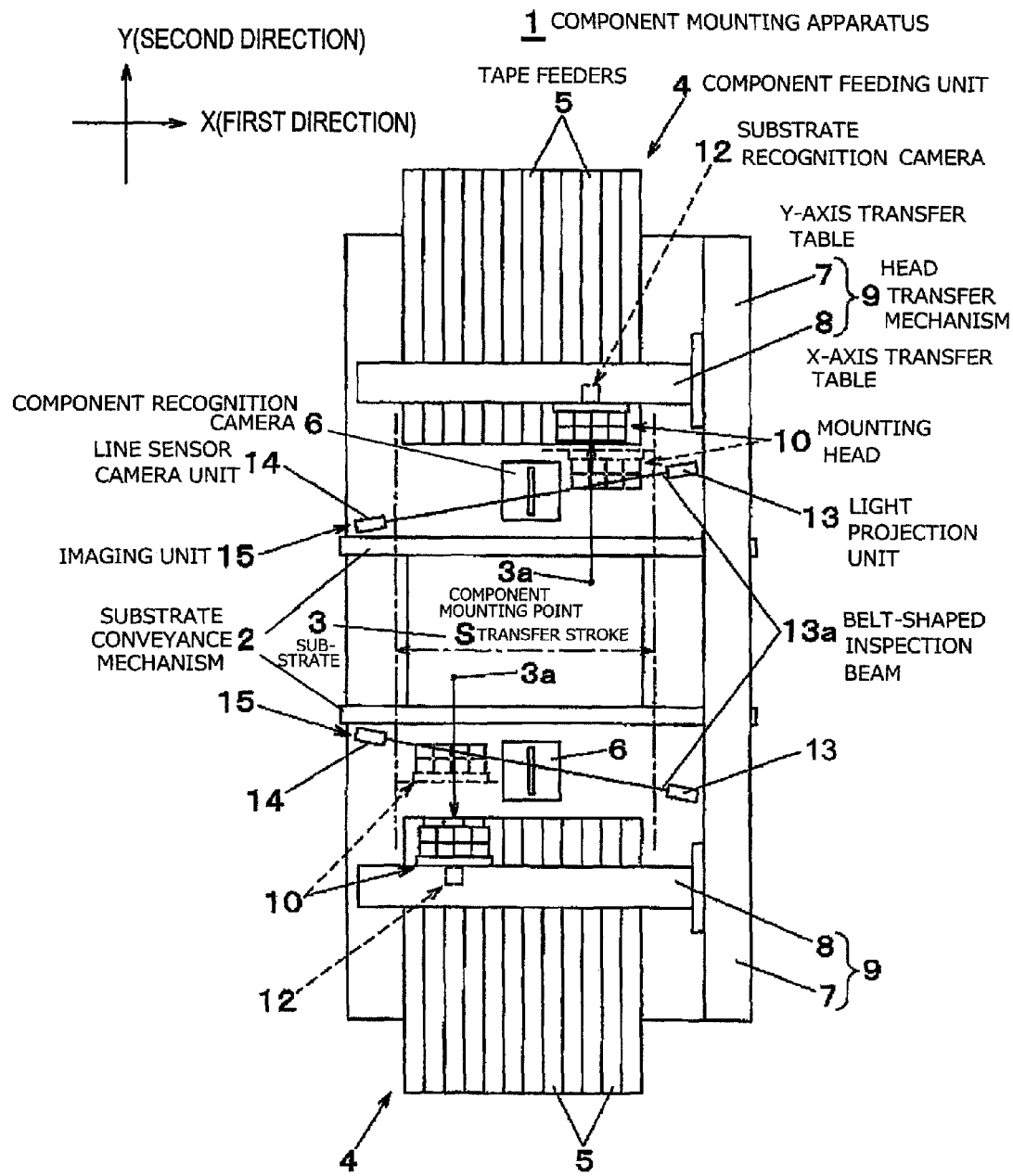
FIG. 1 is a plan view of a component mounting apparatus of an embodiment of the present invention.

An embodiment of the present invention is now described by reference to the drawings. First, a configuration of a component mounting apparatus 1 is now described by reference to FIG. 1. The component mounting apparatus 1 has a function of taking a component out of a component feeding unit by means of a mounting head and transferring and mounting the component on a substrate. In FIG. 1, a substrate conveyance mechanism 2 is disposed along a direction X (a first direction) on an upper surface of a base 1a. The substrate conveyance mechanism 2 conveys a substrate 3 that is to be an object of component mounting operation along the direction X that is a direction of conveyance of a substrate and also positions and retains the substrate at a mounting operation position for a component mounting mechanism which will be described below. In the embodiment, a long substrate that is longer than a substrate of normal type in the direction of conveyance is taken as an objective; namely, the substrate 3.

A component feeding unit 4 is disposed on either side of the substrate conveyance mechanism 2 in a direction Y (a second direction) of the substrate conveyance mechanism 2. In each of the component feeding units 4, a plurality of tape feeders 5 are put side by side. Each of the tape feeders 5 performs pitch-feeding of a carrier tape holding components to be mounted, thereby supplying a component to a pickup position for a mounting head 10. An Y-axis transfer table 7 is disposed at one end of the base 1a in its direction X while being oriented in the direction Y. Two X-axis transfer tables 8 are joined to the Y-axis transfer table 7 so as to be transferrable in the direction Y. The mounting head 10 is fitted to each of the X-axis transfer tables 8 so as to be transferrable in the direction X. The Y-axis transfer table 7 and the X-axis transfer tables 8 are actuated, whereupon the mounting heads 10 are horizontally transferred in both the directions X and Y.

Figure 2:
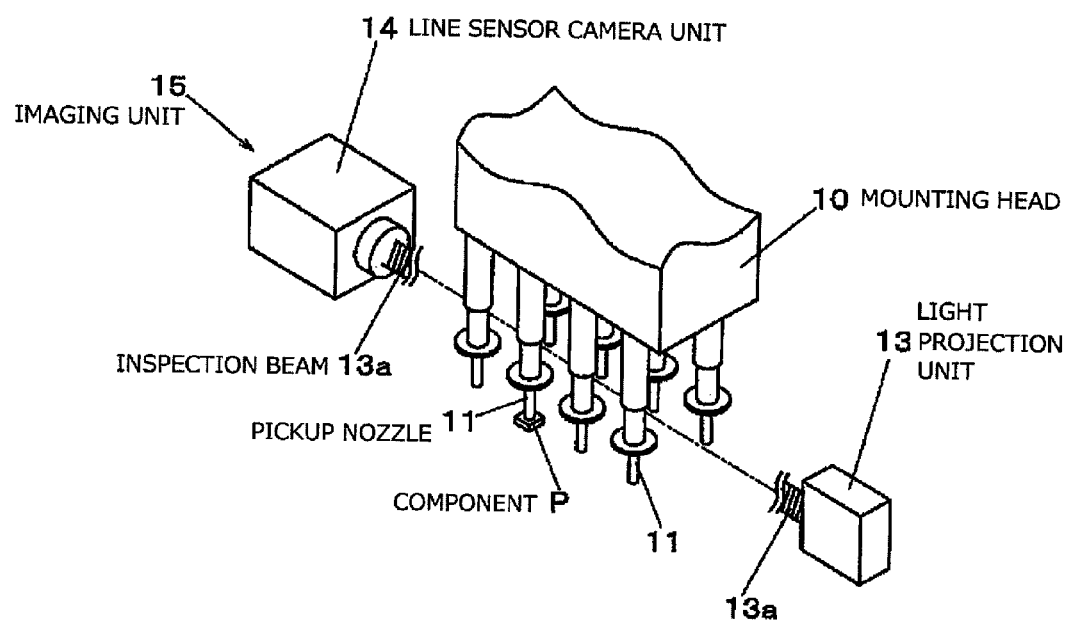
FIG. 2 is an explanatory view of a mounting head belonging to and component detection performed by the component mounting apparatus of the embodiment of the present embodiment.

Specifically, the X-axis transfer tables 8 act as a first transfer mechanism that transfers the mounting heads 10 in the first direction. The Y-axis transfer table 7 acts as a second transfer mechanism that transfers the mounting heads 10 in the second direction. Each pair consisting of the X-axis transfer table 8 and the Y-axis transfer table 7 makes up a head transfer mechanism 9 that transfers a corresponding mounting head 10 between the substrate conveyance mechanism 2 and the component feeding unit 4 disposed beside the substrate conveyance mechanism 2 in its direction Y. As shown in FIG. 2, each of the mounting heads 10 is a multi-type component retaining head having a plurality of pickup nozzles 11 that can individually ascend or descend. Each of the pickup nozzles 11 picks up and retains a component P that is an object of mounting.

An imaging unit 15 made up of a component recognition camera 6, a light projection unit 13, and a line sensor camera unit 14 is interposed between the substrate conveyance mechanism 2 and each of the component feeding units 4. A substrate recognition camera 12 that is transferred in conjunction with the mounting head 10 is put on each of the X-axis transfer tables 8 while an imaging plane of the camera is downwardly oriented. The mounting head 10 picked up components from the component feeding unit 4 performs scanning operation while moving in the direction X above the corresponding component recognition camera 6, whereby the component recognition camera 6 captures an image of the component P (see FIG. 2) picked up and retained by the pickup nozzles 11 of the mounting head 10. An image recognition processing unit 23 (see FIG. 5) subjects an image captured by imaging action to recognition processing, whereby absence/presence or positional displacement of the component P retained by the mounting head 10 can be detected. The substrate recognition camera 12 captures an image of the substrate 3 at timing when the mounting head 10 has transferred to a position above the substrate 3, whereby a position on the substrate 3 where the component is mounted is detected.

In the imaging unit 15, the light projection unit 13 and the line sensor camera unit 14 are positioned opposite to each other such that a transfer pathway for a component-mounting round during which the mounting head 10 moves back and forth between the substrate 3 and the component feeding unit 4 is interposed therebetween. Both the light projection unit 13 and the line sensor camera unit 14 are disposed outside a range of a transfer stroke S of each of the mounting heads 10 in the direction X, thereby preventing the imaging unit 15 from uniting transfer of the mounting heads 10. Each of the light projection units 13 has a function of projecting a highly directional beam, such as a laser beam, in a belt like shape. Each of the line sensor camera units 14 has a function of receiving the belt-shaped inspection beam and outputting the inspection beam as image data that show a state of a lower end of each of the pickup nozzles 11 attached to the mounting head.

As shown in FIG. 2, the imaging unit 15 receives a belt-shaped inspection beam 13*a* projected from the light projection unit 13 by means of the line sensor camera unit 14. There is detected presence or absence of a component brought back by the mounting head 10 in the course of the mounting head returning to the component feeding unit 4 after component mounting operation targeted for a component mounting point 3*a* on the substrate 3; namely, the component P that returns to the component feeding unit 4 while remaining adhered to the lower end of the pickup nozzle 11 without being properly mounted on the substrate 3 during component mounting operation.

Figure 3:
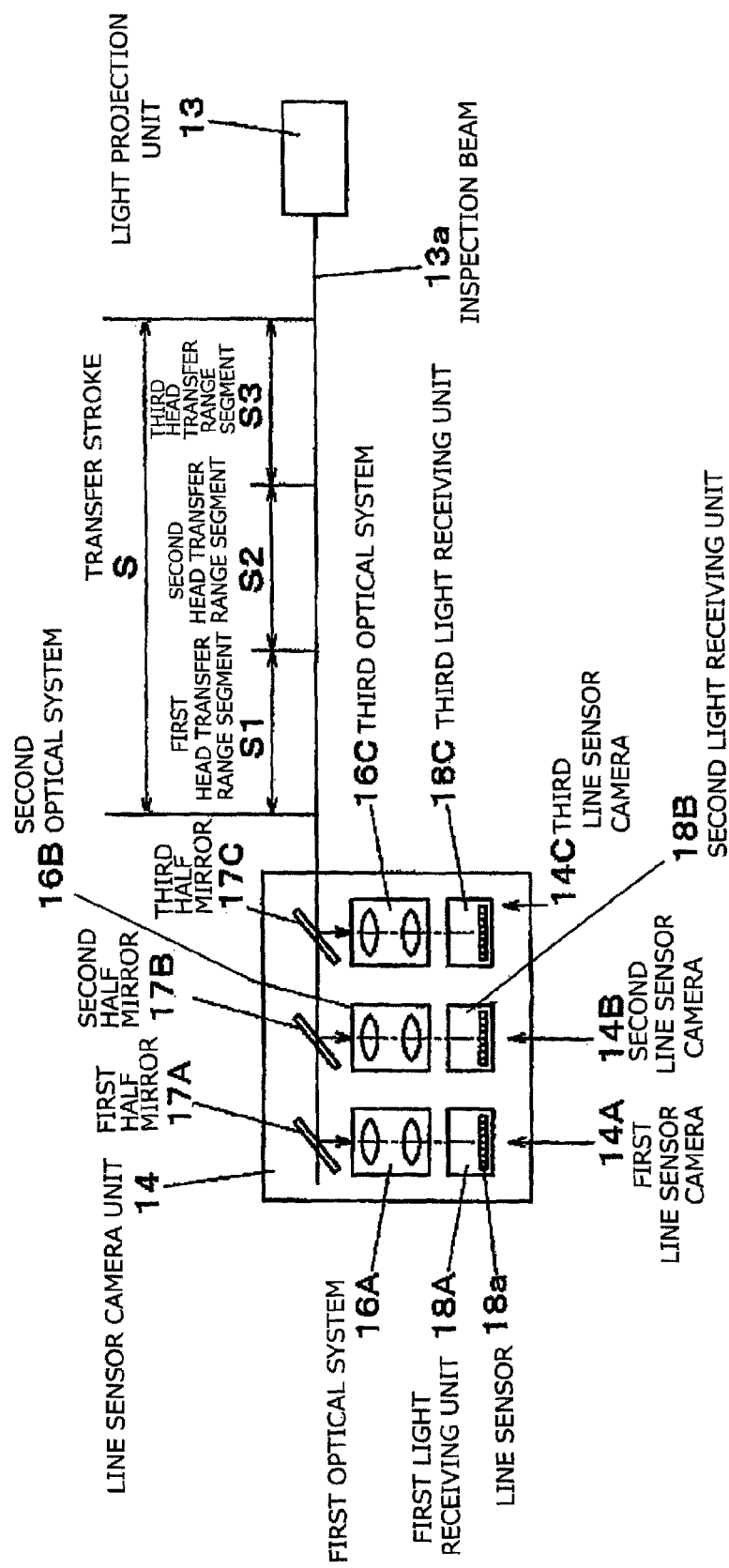
FIG. 3 is an explanatory view of a structure of an imaging unit for component detection in the component mounting apparatus of the embodiment of the present invention.

By reference to FIG. 3, a configuration of the line sensor camera unit 14 employed in the imaging unit 15 is now described. As shown in FIG. 3, the line sensor camera unit 14 is made up of a plurality of (three) line sensor cameras (in the present embodiment); namely, a first line sensor camera 14A, a second line sensor camera 14B, and a third line sensor camera 14C. The first line sensor camera 14A has a first light receiving unit 18A that includes a line sensor 18*a* made up of serially-connected light receiving elements and a first optical system 16A that forms on the line sensor 18*a* an image from incident light for imaging purpose. The second line sensor camera 14B has a second light receiving unit 18B that includes the line sensor 18*a* made up of serially-connected light receiving elements and a second optical system 16B that forms on the line sensor 18*a* an image from incident light for imaging purpose. The third line sensor camera 14C has a third light receiving unit 180 that includes the line sensor 18*a* made up of serially-connected light receiving elements and a third optical system 160 that forms on the line sensor 18*a* an image from incident light for imaging purpose.

The inspection beam 13*a* projected from the light projection unit 13 undergoes reflection on a first half mirror 17A disposed for the first line sensor camera 14A, to thus enter the first light receiving unit 18A by way of the first optical system 16A. The inspection beam 13*a* projected from the light projection unit 13 undergoes reflection on a second half mirror 17B disposed for the second line sensor camera 14B, to thus enter the second light receiving unit 18B by way of the second optical system 16B. The inspection beam 13*a* projected from the light projection unit 13 undergoes reflection on a third half mirror 17C disposed for the third line sensor camera 14C, to thus enter the third light receiving unit 18C by way of the third optical system 16C. Each of the mounting heads 10 is transferred in such a way that the lower end of the pickup nozzle 11 that is an imaging object crosses the inspection beam 13*a*, whereby a one-dimensional image of a neighborhood of the lower end of the pickup nozzle 11 is formed on the light receiving elements of each of the line sensors 18*a*.

In the configuration, each of the first optical system 16A, the second optical system 168, and the third optical system 16C is an optical system having a fixed focal point. A focusing point employed when the optical system forms an image of an imaging object on the line sensor 18*a* is set to a different position according to the optical system. In the embodiment, the transfer stroke S of the mounting head 10 achieved in the first direction is classified into a plurality of (three) head transfer range segments; namely, a first head transfer range segment S1, a second head transfer range segment 82, a third head transfer range segment S3. The focusing point of the first optical system 16A is set so as to lie in a neighborhood of a substantial center of the first head transfer range segment S1 along the inspection beam 13*a*. The focusing point of the second optical system 16B is set so as to lie in a neighborhood of a substantial center of the second head transfer range segment S2 along the inspection beam 13*a*. The focusing point of the third optical system 16C is set so as to lie in a neighborhood of a substantial center of the third head transfer range segment S3 along the inspection beam 13*a*.

Figure 4A:
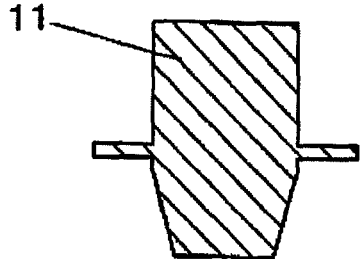
FIGS. 4(a), (b), (c) are explanatory views of component detection performed by the component mounting apparatus of the embodiment of the present invention.
Figure 4B:
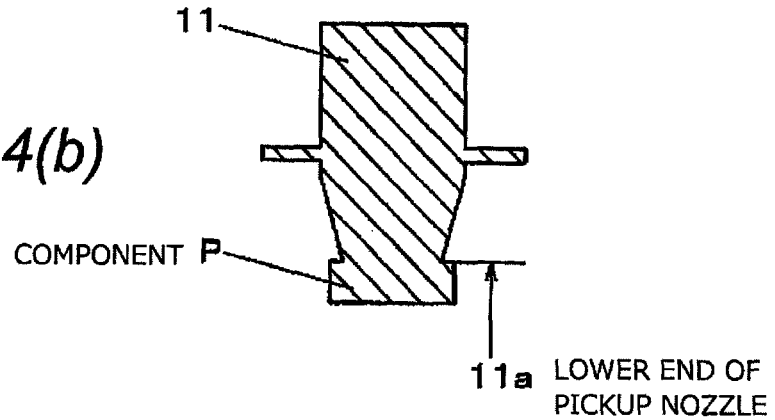
Figure 4C:
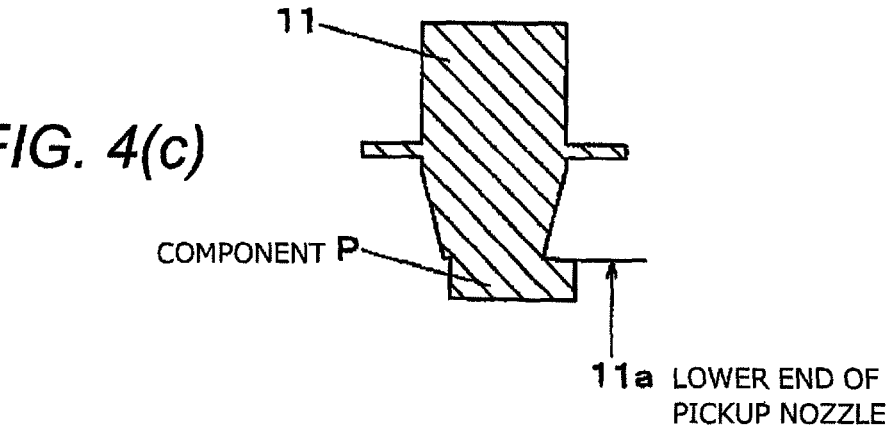

At the time of transfer operation during which each of the mounting heads 10 returns to the component feeding unit 4 from the component mounting point 3*a*, a prediction made in advance about an imaging position at which the pickup nozzle 11, or an imaging object, crosses the inspection beam 13*a* falls in which one of the first head transfer range segment S1, the second head transfer range segment S2, and the third head transfer range segment S3. During imaging operation performed by the imaging unit 15, one-dimensional image data output from the line sensor camera having an optical system whose focusing point is set in correspondence with the head transfer segment crossed by the transfer pathway are selectively taken as image data for detecting presence or absence of the component P (see FIGS. 4(a), 4(b), and 4(c)). As a result, during the component-mounting round during which the mounting head 10 moves back and forth between the substrate 3 and the component feeding unit 4, the focusing point can be substantially matched to the transfer pathway of the mounting head 10 in each of the component-mounting rounds. When the long substrate 3 is taken as an object and when a distance between the pickup nozzle 11 that is an imaging object and the line sensor camera unit 14 varies in each component-mounting round, a clear image exhibiting a superior focusing level can be acquired.

Moreover, each of the first optical system 16A, the second optical system 16B, and the third optical system 16C is configured in such a way that a plurality of lens groups are combined so as to be movable along the direction of an optical axis. An imaging range of each of the first line sensor camera 14A, the second line sensor camera 14B, and the third line sensor camera 14C can be adjusted to a desired size according to each of the focusing points. As a result, even when the long substrate 3 is taken as an object and when the pickup nozzle 11 situated at a position distant from the line sensor camera unit 14 is taken as an imaging object, the imaging range can be set to a size appropriate for detecting a component, so that accuracy of recognition can be enhanced.

In the embodiment, each of the imaging units 15 is made up of the light projection unit 13 that projects the belt-like inspection beam 13a and the line sensor camera unit 14 that is made up of a plurality of line sensor cameras (the first line sensor camera 14A, the second line sensor camera 14B, and the third line sensor camera 14C) which receive the inspection beam 13a and which output the light as image data showing a state of the lower end of the pickup nozzle 11 attached to each of the mounting heads 10. The light projection unit 13 and the line sensor camera unit 14 are disposed opposite to each other with the transfer pathway of the mounting head 10 sandwiched outside the range of the transfer stroke S of each of the mounting heads 10 in the first direction.

The first line sensor camera 14A is equipped with the first optical system 16A whose focusing point is set in correspondence with the first head transfer range segment S1 that is one of sub-segments into which the transfer stroke S in the first direction is divided. The second line sensor camera 14B is equipped with the second optical system 16B whose focusing point is set in correspondence with the second head transfer range segment 82 that is one of sub-segments into which the transfer stroke S in the first direction is divided. The third line sensor camera 14C is equipped with the third optical system 16C whose focusing point is set in correspondence with the third head transfer range segment 83 that is one of sub-segments into which the transfer stroke S in the first direction is divided. The first optical system 16A has a zooming mechanism for adjusting the imaging range of the first line sensor camera 14A to a desired size in accordance with the focusing point of the first line sensor camera 14A. The second optical system 16B has a zooming mechanism for adjusting the imaging range of the second line sensor camera 14B to a desired size in accordance with the focusing point of the second line sensor camera 14B. The third optical system 16O has a zooming mechanism for adjusting the imaging range of the third line sensor camera 14C to a desired size in accordance with the focusing point of the third line sensor camera 14C.

Figure 5:
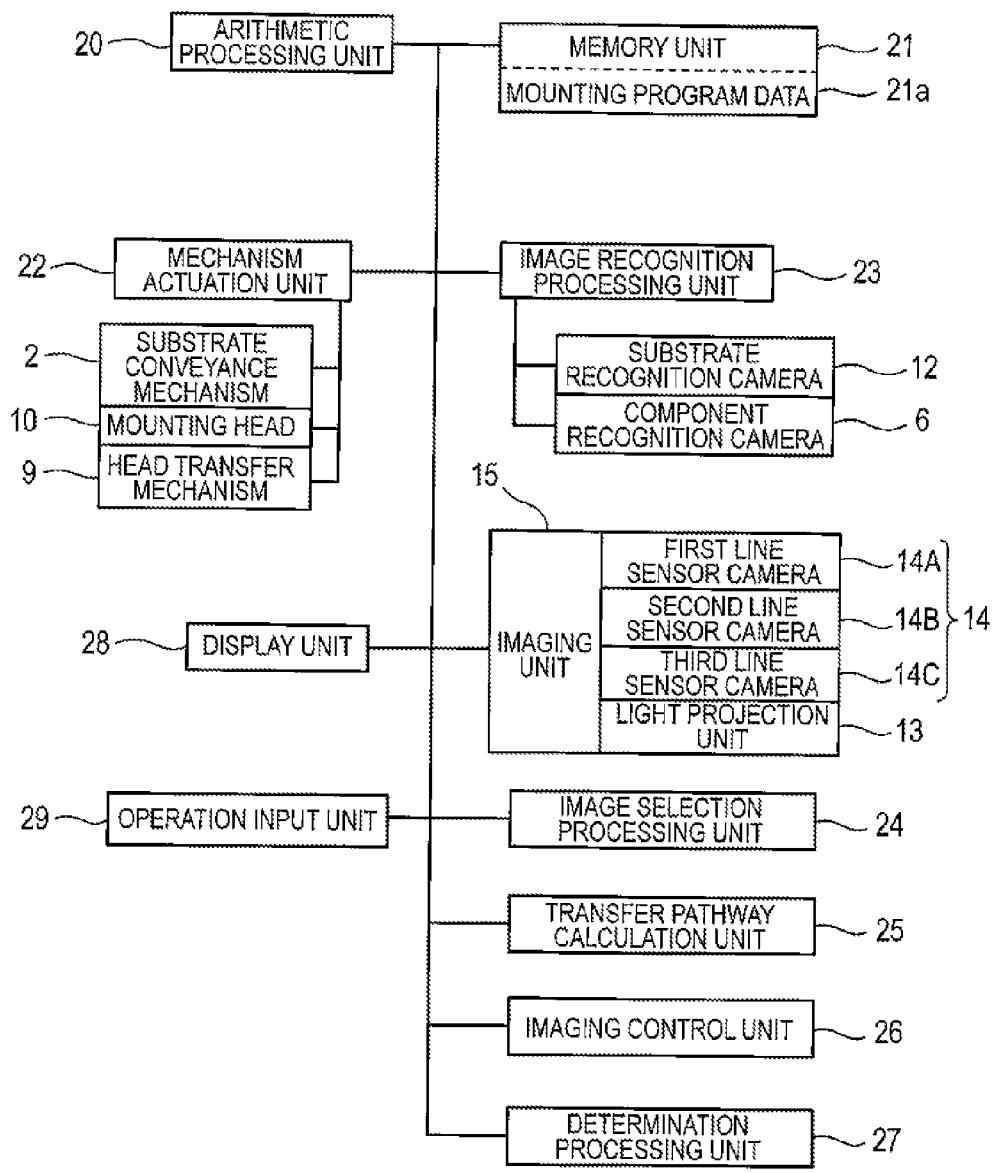
FIG. 5 is a unit diagram showing a configuration of a control system of the component mounting apparatus of the embodiment of the present invention.

By reference to FIG. 5, a configuration of a control system is now described. An arithmetic processing unit 20 is a CPU. According to a program or data stored in a memory unit 21, the arithmetic processing unit 20 controls respective units provided below, thereby letting the units perform operation or processing that is necessary for the component mounting apparatus 1 to perform component mounting operation. The memory unit 21 stores mounting program data 21a including an operation program for component mounting operation, mount data, and the like. The mounting program data 21a include mount sequence data showing a sequence of execution of mounting operation targeted for a plurality of component mounting points set on the substrate 3, mounting position data for locating positions of the respective component mounting points.

A mechanism actuation unit 22 actuates the substrate conveyance mechanism 2, the mounting heads 10, and the head transfer mechanisms 9 under control of the arithmetic processing unit 20. The image recognition processing unit 23 subjects image data acquired by the substrate recognition cameras 12 and the component recognition cameras 6 to recognition processing. Positions of the component mounting points on the substrate 3 and positional displacements of the components P retained by the respective mounting heads 10 are thereby detected. By means of component positioning operation during which the head transfer mechanisms 9 transfer the respective mounting heads 10, positional corrections are made on the basis of results of positional recognition. The image recognition processing unit 23 combines together one-dimensional images output from the respective line sensor camera unit 14 making up the imaging unit 15, thereby acquiring two-dimensional image data representing a state of lower ends of the plurality of pickup nozzles 11 of each of the mounting heads 10. The line sensor camera unit 14 and the light projection unit 13 of the imaging unit 15 are controlled by an imaging control unit 26 which will be described below.

An image selection processing unit 24 has a function of selectively capturing the image data output from the first line sensor camera 14A, the second line sensor camera 14B, and the third line sensor camera 14C of the line sensor camera unit 14 under control of the imaging control unit 26. A transfer pathway calculation unit 25 has a function of deriving from the mounting program data 21a targeted for the substrate 3, a transfer pathway of each of the mounting heads 10 for a component-mounting round during which the mounting head 10 moves back and forth between the component feeding unit 4 and the substrate 3 positioned and retained by the substrate conveyance mechanism 2, in each component-mounting round.

Specifically, a location of a transfer destination for a next component-mounting round employed when the mounting head 10 returns from the component mounting point 3a for one component-mounting round to the component feeding unit 4 in order to pick up a component for another component-mounting round is specified by means of mounting sequence data and mounting position data included in the mounting program data 21a. There is thereby derived a position where the transfer pathway of the mounting head 10 crosses the inspection beam 13a that originates from the light projection unit 13 to the line sensor camera unit 14 in the imaging unit 15.

The imaging control unit 26 controls imaging operation performed by the imaging unit 15 and the image selection processing unit 24 on the basis of data pertaining to the transfer pathway derived by the transfer pathway calculation unit 25, as well. It is thereby possible to select image data output from the line sensor camera, among the plurality of line sensor cameras; namely, the first line sensor camera 14A, the second line sensor camera 14B, and the third line sensor camera 14C, that is assigned to the head transfer range segment where the transfer pathway of one of the mounting heads 10 in each of the component-mounting rounds crosses the inspection beam 13a and to let the recognition processing unit 23 capture the thus-selected image data. A determination processing unit 27 performs processing for determining whether or not the component P is on the lower end of the pickup nozzle 11 according to the image data selectively captured by the image selection processing unit 24.

A display unit 28 is a display panel, like a liquid crystal panel. In addition to displaying images captured by the substrate recognition camera 12, the component recognition camera 6, and the imaging unit 15, the display unit 28 displays a guide screen for inputting a command, data, and the like, used for operating the component mounting apparatus 1. An operation input unit 29 is input means, like touch panel switches provided on a keyboard or in a display screen of the display unit 28. The operation input unit 29 enables entry of commands and data for operation.

Figure 6:
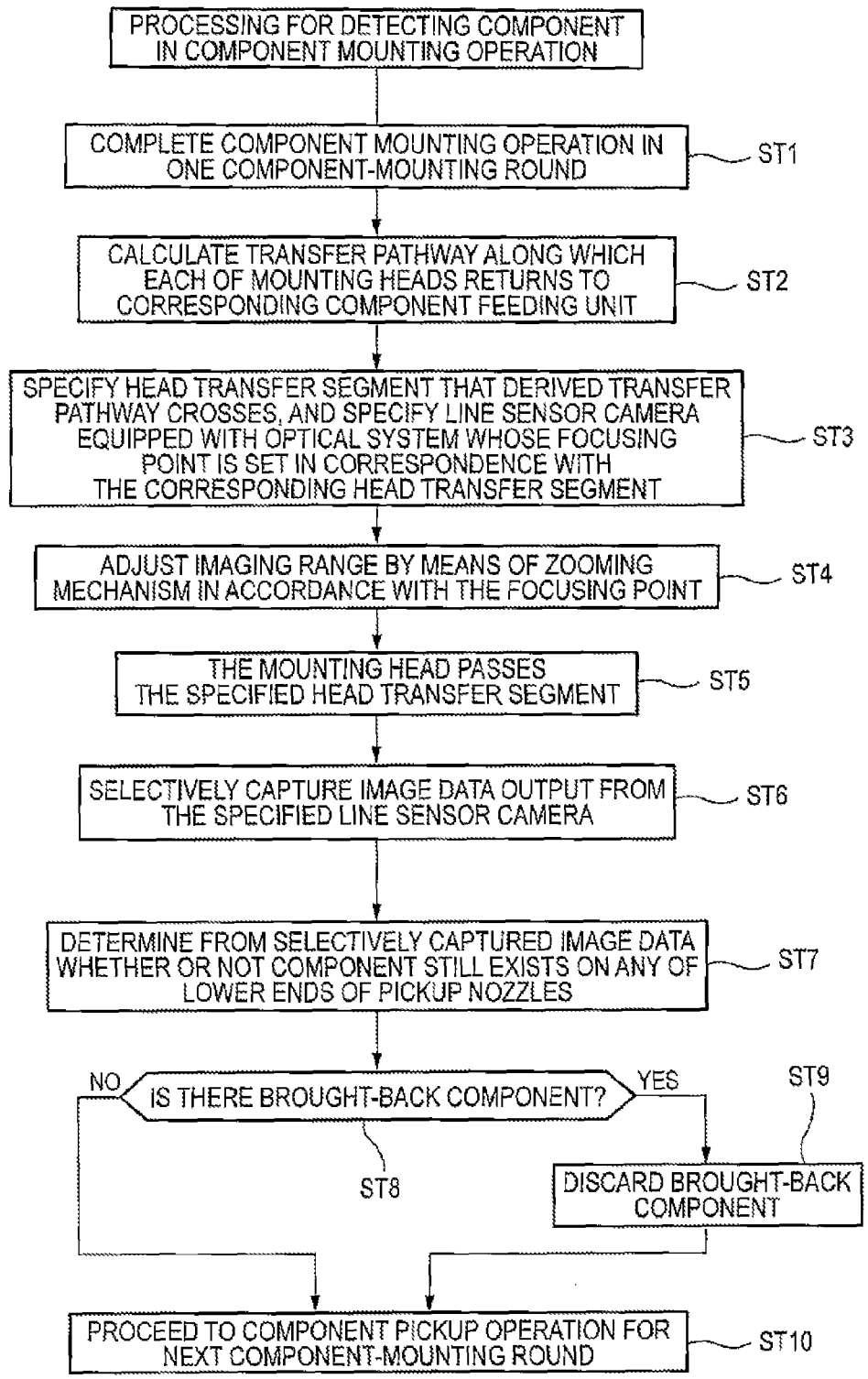
FIG. 6 is a flowchart showing component detection processing performed under a component mounting method of the embodiment of the present invention.

By reference to FIG. 6, component detection processing of the embodiment is now described. Component detection processing is for a component mounting apparatus in which the mounting head 10 picks up a component from a corresponding component feeding units 4 and transfers and populates the component on the long substrate 3; specifically, intended for detecting whether or not the components P is still on the lower ends of the respective pickup nozzles 11 provided on the mounting head 10 in the component-mounting round during which the mounting head 10 moves back and forth between the substrate 3 and the component feeding unit 4.

In FIG. 6, component mounting operation for one component-mounting round is first completed (ST1). For instance, as shown in FIG. 1, component mounting operation targeted for the component mounting point 3a on the substrate 3 is performed. Next, the transfer pathway calculation unit 25 calculates the transfer pathway along which each of the mounting heads 10 returns to the component feeding unit 4 in order to shift to a next component-mounting round, by reference to the mounting program data 21a (ST2). Specifically, a transfer pathway of each of the mounting heads 10 in a component-mounting round during which the mounting head 10 moves back and force between the component feeding unit 4 and the substrate conveyance mechanism 2 is derived for each component-mounting round on the basis of the mounting program data 21a targeted for the substrate 3 (a transfer pathway calculation step).

A head transfer segment that the thus-derived transfer pathway crosses is now specified, and a line sensor camera equipped with the optical system whose focusing point is set in correspondence with the head transfer segment is specified (ST3). The zooming mechanism adjusts an imaging range of the thus-specified line sensor camera in accordance with the focusing point (ST4). Incidentally, zoom adjustment does not need to be performed in each case, so long as the line sensor cameras have individually performed zoom adjustment in advance.

Subsequently, during transfer operation in which each of the mounting heads 10 having finished performing component mounting operation returns to the corresponding component feeding unit 4, the mounting head 10 passes through the specified head transfer segment, thus crossing the inspection beam 13a (ST5). The image selection processing unit 24 selectively captures the image data output from the specified line sensor camera (ST6). Specifically, in (ST3) and (ST6) the image selection processing unit 24 is controlled on the basis of data pertaining to the transfer pathway derived by the transfer pathway calculation unit 25. Image data output from the line sensor camera assigned to the head transfer range segment that the transfer pathway of each of the mounting heads 10 crosses in each of component-mounting rounds are thereby, selectively captured (an imaging control step). Subsequently, it is determined, on the basis of the selectively captured image data, whether or not the component P is still on the lower end of the pickup nozzle 11 (ST7) (a determination processing step).

Even when the transfer pathway of the mounting head 10 changes in each of the component-mounting rounds, image data output from the line sensor camera whose focusing point is set in correspondence with the head transfer range segment that the transfer pathway crosses are selectively captured, and hence a clear image exhibiting a high focusing level can be acquired by means of imaging performed by the line sensor camera unit 14. Even when the pickup nozzles 11 in the course of moving along the transfer pathway situated remotely from the line sensor camera unit 14 are taken as imaging targets, the imaging field of view is set to an appropriate size, thereby making it possible to enhance a degree of recognition accuracy.

A determination is then made as to whether or not a component is brought back (ST8). When no component is determined to be brought back, the mounting head 10 is transferred to the component feeding unit 4, where the mounting head 10 proceeds to component pickup operation for a next component-mounting round (ST10). On the contrary, when the component is determined to be brought back in (ST8), the mounting head 10 is transferred to a component discard box set within the head transfer range. After the brought-back component still retained by the pickup nozzle 11 is discarded (ST9), the mounting head 10 proceeds to component pickup operation for a next component-mounting round (ST10).

As mentioned above, in the component mounting apparatus described in connection with the embodiment, a transfer pathway of each of the mounting heads 10 in a component-mounting round during which the mounting head 10 moves back and forth between the corresponding component feeding unit 4 and the substrate conveyance mechanism 2 is derived for each component-mounting round from the mounting program data 21a. On the basis of data pertaining to the thus-derived transfer pathway, image data output from the line sensor camera assigned to the head transfer range segment that the transfer pathway of the mounting head 10 crosses in each of component-mounting rounds are selected and captured. The image data output from the line sensor camera whose focusing point substantially matches the imaging target can be used for detecting whether or not a component still exists. Even when the long substrate 3 is taken as an object, it is possible to detect with high accuracy whether or not a component still exists on any of the pickup nozzles 11 of the mounting heads 10.

The present patent application is based on Japanese Patent Application (JP-2010-182043) filed on Aug. 17, 2010, the entire subject matter of which is incorporated herein by reference.

INDUSTRIAL APPLICABILITY

The component mounting apparatus and the component detection method of the present invention yields an advantage of the ability to detect with high accuracy whether or not a component is still on a pickup nozzle of a mounting head even when a long substrate is taken as an object. The apparatus and the method are useful in a component mounting field where a mounting head picks up a component from a component feeding unit and transfers and populates the component on the substrate.

DESCRIPTIONS OF THE REFERENCE NUMERALS AND SYMBOLS

1 COMPONENT MOUNTING APPARATUS
2 SUBSTRATE CONVEYANCE MECHANISM
3 SUBSTRATE
3a COMPONENT MOUNTING POINT
4 COMPONENT FEEDING UNIT
5 TAPE FEEDER
7 Y-AXIS TRANSFER TABLE
8 X-AXIS TRANSFER TABLE
9 HEAD TRANSFER MECHANISM
10 MOUNTING HEAD
11 PICKUP NOZZLE
13 LIGHT PROJECTION UNIT
14 LINE SENSOR CAMERA UNIT
14A FIRST LINE SENSOR CAMERA
14B SECOND LINE SENSOR CAMERA
14C THIRD LINE SENSOR CAMERA
15 IMAGING UNIT
16A FIRST OPTICAL SYSTEM
16B SECOND OPTICAL SYSTEM
16C THIRD OPTICAL SYSTEM
18a LINE SENSOR
18A FIRST LIGHT RECEIVING UNIT
18B SECOND LIGHT RECEIVING UNIT
18C THIRD LIGHT RECEIVING UNIT
P COMPONENT

The invention claimed is:

1. A component mounting apparatus that picks up components from a component feeding unit by a mounting head, transferring and mounting the component on a substrate, the apparatus comprising:
a substrate conveyance mechanism that conveys the substrate in a first direction, positioning and retaining the substrate at a component mounting operation position and a head transfer mechanism that transfers the mounting head in the first direction and a second direction orthogonal to the first direction by a first transfer mechanism and a second transfer mechanism, thereby moving the respective mounting heads between the substrate conveyance mechanism and the component feeding unit disposed beside the substrate conveyance mechanism in the second direction thereof;
an imaging unit that includes a light projection unit for projecting a belt-like inspection beam and a plurality of line sensor cameras which receive the inspection beam and which output the beam as image data representing a state of a lower end of a pickup nozzle attached to the mounting head and that are configured such that the light projection unit and the plurality of line sensor cameras are placed opposite to each other with a transfer pathway of the mounting head interposed therebetween and outside a transfer stroke of the mounting head in the first direction thereof;
optical systems that are provided for the plurality of line sensor cameras respectively and have focusing points set in correspondence with any of head transfer range segments which have been determined by dividing the transfer stroke in the first direction into a plurality of pieces, and an image selection processing unit that selectively captures image data output from the plurality of line sensor cameras;
a transfer pathway calculation unit that derives, in each of component-mounting rounds, from mounting program data targeted for the substrate the transfer pathway of the mounting head in a component-mounting round during which the mounting head is moved back and forth between the component feeding unit and the substrate conveyance mechanism;
an imaging control unit that controls the image selection processing unit on the basis of data pertaining to the derived transfer pathway, thereby selecting and capturing image data output from the line sensor cameras assigned to the head transfer range segments that the transfer pathway of the mounting head cross during each of the component-mounting rounds; and
a determination processing unit that determines from the selectively captured image data whether or not a component exists on the lower end of the pickup nozzle.

2. The component mounting apparatus according to claim 1, wherein each of the optical systems is equipped with a zooming mechanism adjusting an imaging range of the corresponding line sensor camera to a desired size in accordance with the focusing point of the optical system.

3. A component detection method for detecting whether or not a component exists on a lower end of a pickup nozzle of a mounting head in a component mounting apparatus that picks up a component from a component feeding unit by the mounting head, transferring and mounting the component on a substrate, wherein
the apparatus comprises
a substrate conveyance mechanism that conveys the substrate in a first direction, positioning and retaining the substrate at a component mounting operation position and a head transfer mechanism that transfers the mounting heads in the first direction and a second direction orthogonal to the first direction by a first transfer mechanisms and a second transfer mechanism, thereby moving the mounting head between the substrate conveyance mechanism and the component feeding unit disposed beside the substrate conveyance mechanism in the second direction thereof,
an imaging unit that includes a light projection unit for projecting a belt-like inspection beam and a plurality of line sensor cameras which receive the inspection beam and which output the beam as image data representing a state of a lower end of a pickup nozzle attached to the mounting head and that are configured such that the light projection unit and the plurality of line sensor cameras are placed opposite to each other with a transfer pathway of the mounting head interposed therebetween and outside a transfer stroke of the mounting head in the first direction thereof, and
optical systems provided for the plurality of line sensor cameras respectively and have focusing points set in correspondence with any of head transfer range segments which have been determined by dividing the transfer stroke in the first direction into a plurality of pieces, and an image selection processing unit that selectively captures image data output from the plurality of line sensor cameras; and wherein
the method includes
a transfer pathway calculation step of deriving, in each of component-mounting rounds, from mounting program data targeted for the substrate the transfer pathway of the mounting head in a component-mounting round during which the mounting head is moved back and forth between the respective component feeding units and the substrate conveyance mechanism, an imaging control step of controlling the image selection processing unit on the basis of data pertaining to the derived transfer pathways, thereby selecting and capturing image data output from the line sensor cameras assigned to the respective head transfer range segments that the transfer pathways of the mounting head cross during each of the component-mounting rounds, and a determination processing step of determining from the selectively captured image data whether or not a component still exists on the lower end of the pickup nozzle.

4. The component detection method according to claim 3, wherein each of the optical systems is equipped with a zooming mechanism for adjusting an imaging range of the corresponding line sensor camera to a desired size, and in the imaging control step the imaging ranges are adjusted in accordance with the focusing points of the respective optical systems.

* * * * *